United States Patent [19]
Huber

[11] Patent Number: 5,424,638
[45] Date of Patent: Jun. 13, 1995

[54] SAMPLED DATA FLAW DETECTION FOR MAGNETIC MEDIA

[75] Inventor: William D. Huber, San Jose, Calif.

[73] Assignee: Seagate Technology, Inc., Scotts Valley, Calif.

[21] Appl. No.: 219,991

[22] Filed: Mar. 30, 1994

[51] Int. Cl.[6] .................... G01R 33/12; G11B 27/00; G01N 27/82

[52] U.S. Cl. .................... 324/212; 360/25; 369/58; 371/21.1

[58] Field of Search ............ 324/210, 212; 360/25, 360/31; 369/53, 58; 371/21.1, 21.4

[56] References Cited

U.S. PATENT DOCUMENTS

| | | | |
|---|---|---|---|
| 4,881,136 | 11/1989 | Shiraishi et al. | 360/25 |
| 4,929,894 | 5/1990 | Monett | 324/212 |
| 5,121,057 | 6/1992 | Huber et al. | 324/212 |
| 5,247,254 | 9/1993 | Huber et al. | 324/212 |

OTHER PUBLICATIONS

Magnetic Characterization Using Elements of a PRML Channel by Jonathan D. Coker, Richard L. Galbraith, Gregory J. Kerwin from IEEE Transactions Magazine, vol. 27, No. 6, Nov. 1991.

*Primary Examiner*—Walter E. Snow
*Attorney, Agent, or Firm*—Edward P. Heller, III; Patrick T. King

[57] ABSTRACT

An apparatus and method for detecting defects in the magnetic medium of a disk drive system includes sampling the output signal of the read channel of the system to provide a sampled output signal. In one embodiment, the sampled output signals from the read channel is squared. A delayed sampled output signal is also provided. The squared sampled output signal is summed with the delayed squared output signal. The square of the expected value of the sum of the squared sampled output signal and the delayed squared output signal is subtracted from the sum to provide a difference output signal. A threshold detector determines when the difference output signal of the subtraction means exceeds a predetermined threshold to provide an output signal indicative of a defect in the medium. One threshold detector determines when the absolute value of the difference output signal exceeds a predetermined threshold value. Another threshold detector determines when the difference output signal of the subtraction means exceeds either a predetermined upper threshold value or a predetermined lower value. The expected value may be a constant. In another embodiment, the absolute value of the sampled output signal and a delayed sampled absolute-value output signal are summed together.

24 Claims, 4 Drawing Sheets

SAMPLED DATA FLAW DETECTION FOR MAGNETIC MEDIA

BACKGROUND OF THE INVENTION

1. Field of the Invention.

This invention relates to techniques for detecting defects in the thin layer of magnetic material which serve as the magnetic storage media for a rigid disk drive, system.

2. Prior Art.

Data information is stored in a magnetic media by magnetizing a small area of the magnetic media. Small, random defects or flaws in the thin layer of magnetic material for a rigid disk can result in storage and subsequent playback of erroneous data bits. These erroneous data bits are created when data information is initially written into a defective area of the disk. These erroneous data bits are then subsequently read out from the disk. A data bit error for a particular bit corresponding to a particular area of the disk is caused either by the magnetization for a bit being missing or by magnetization being added at the storage location. In order to test and identify defects in the thin layer of magnetic material of a disk, a typical prior art technique is to perform a surface analysis of the thin layer of magnetic material on the disk and to produce an error map for the recording surface of the disk. The error map is then used to avoid the defective areas of the disk during subsequent recording and playback of data information. To perform a surface analysis, the disk is formatted and the locations of defects are stored in the header fields at the beginning of the data records stored on the various tracks of a disk. During read/write operations, the headers are looked at to avoid the defective recording areas on the disk.

To detect flaws in a :magnetic media for a disk storage device, a test signal such as a high frequency, alternating data pattern is written onto the disk. This pattern is then read out of the disk as a high frequency output test signal which has a sinusoidal waveform. This high frequency output test signal with its sinusoidal waveform is then observed for deviations from an expected sinusoidal waveform to indicate the occurrence of a defect on the disk. Previously, it was necessary to write and rewrite such a test pattern on the disk a number of times. This was because the previous flaw-detection systems used narrow-band tracking notch filters to remove the expected sinusoidal signal and to pass only those sidebands representing error information. A narrow-band tracking filter, which uses a delay line, is disclosed in U.S. Pat. No. 4,929,894 entitled "Method and Apparatus for Increasing Throughput on Disk Drive Quality Control Testing" by M. Monett. In the frequency domain, the defect, or error, information is in the form of sidebands around the carrier. These sidebands are produced by amplitude and phase modulation of the test pattern by the defects on the disk. Previous detection systems were only amplitude-sensitive and not phase-sensitive. This meant that defects causing phase errors went undetected. Consequently, it was necessary to write and rewrite the test signal a number of times in order to find the defects.

U.S. Pat. No. 4,881,136 entitled "Method and Apparatus for Detecting Minute Defects on Magnetic Disk by Monitoring Both Amplitude Decrease and Phase Shift of a Reproduced Signal" to Shiraishi discloses a disk-error detection system which makes repeated passes to detect errors in a continuous signal and which uses peak-to-peak amplitude detectors.. An analog signal-processing apparatus for detecting a flaw in a magnetic media is disclosed in U.S. Pat. No. 5,121,057 titled "Media Flaw Detection Apparatus for a Magnetic Disk Drive with Squaring and Summary of In-Phase and Quadrature-Phase Detected Signals" to Huber et al. The Huber 057 patent uses analog techniques for detection of flaws in a magnetic media. In one embodiment disclosed in the Huber 057 patent, an analog input signal is multiplied by an in-phase reference signal and also by an analog quadrature-phase reference signal, using a pair of balanced modulators as analog multipliers. The analog out,put signals from each of the analog multipliers are then squared and summed together to produce an analog signal which is representative of a flaw in the magnetic media. In another analog embodiment disclosed in the Huber 057 patent, an analog input signal is squared using a balanced modulator. The analog input signal is also phase shifted by 90 degrees and the phase-shifted signal is also squared. Both of the squared analog signals are then summed together. The summed analog signal is then low-pass filtered to provide an analog signal which is representative of a flaw in the magnetic media.

A need exists for digital techniques to detect flaws in a magnetic storage media, where the digital technique uses digitized, discrete time signals and digital signal processing techniques. A need also exists for a simplified technique for processing a playback signal from a magnetic media which contains a flaw. A need also exists for a phase-insensitive system for detecting flaws in a magnetic media, which system does not require phase synchronous sampling of the input signal.

SUMMARY OF THE INVENTION

It is therefore an object of the invention to provide a digital signal processing technique for detecting flaws in a magnetic storage medium which is used, for example, with a disk drive system for recording information on a magnetic disk medium.

In accordance with these and other objects of the invention, apparatus and a method are provided for detecting defects in a magnetic storage medium. The magnetic storage medium is used with, for example, a disk drive data storage system. A read channel provides an output signal and means for generating a recovered clock signal. The invention uses sampled-data, discrete-time samples of the read channel signal. In one embodiment the squares of the input signal and a delayed input signal are processed. The invention has a hardware simplification which uses only the absolute values of signals rather than the square of the signals.

A uniform signal pattern is written onto the magnetic disk medium such that the read-back waveform is sinusoidal and is passed through an anti-aliasing filter prior to a sampling analog-to-digital converter. The input signal is sampled at a rate of 4 times the frequency of the sinusoidal read-back waveform. The analog output signal of the read channel is sampled to provide a digital sampled output signal $x_n$.

One embodiment of the invention uses squared signals. Squaring means square the sampled output signals from the read channel and provide a squared sampled output signal $x_n^2$. Delay means for the squared sampled output signal provide a delayed squared sampled output signal $x_{n-1}^2$ Summing means sum the squared sampled output signal together with the delayed squared output signal and provide a sum output signal $x_n^2 + x_{n-1}^2$. Subtraction means subtract the expected value $K_n^2$ of the sum of the squared sampled output signal and the delayed squared output signal to provide a difference output signal. Threshold means determining when the difference output signal of the subtraction means exceeds a predetermined threshold to provide an output signal indicative of a defect in the medium. The expected value $K_n^2$ is either a variable or a constant, for example, when a system with automatic gain control AGC is used.

The expression $(x_n^2 + x_{n-1}^2)$ is an estimator of the energy in the input sinusoidal signal. In flaw detection we are looking for small variations in the signal's energy. We can notch filter the sine wave before the energy detector, or subtract out the average estimated energy after energy detection. Either way we are looking for a phase-independent energy detector.

Another embodiment of the invention uses the absolute values of the sampled input signal. Means are provided for taking the absolute value of the sampled output signal to provide a sampled absolute-value output signal $|x_n|$. Delay means delay the sampled absolute-value output signal to provide a delayed sampled absolute-value output signal $|x_{n-1}|$. Sum means sum together the sampled absolute-value output signal $|x_n|$ and the delayed sampled absolute-value output signal $|x_{n-1}|$ to provide a summed output signal $|x_n| + |x_{n-1}|$. Subtraction means subtract the value of a tracking threshold estimator signal from the summed output signal to provide a difference output signal. A constant is subtracted if AGC is used.

The threshold means for both embodiments described above includes two options. In one option, the threshold means includes means for determining when the absolute value of the difference output signal of the subtraction means exceeds a predetermined threshold value to provide the signal indicative of a defect in the medium. In the other option the threshold means includes means for determining when the difference output signal of the subtraction means exceeds either a predetermined upper threshold value or a predetermined lower value to provide the output signal indicative of a defect in the medium.

The embodiment of the invention which uses the absolute value of the sampled input signal includes an additional input signal to the sum means. A means for determining the maximum of either the sampled absolute-value output signal $|x_n|$ or the delayed sampled absolute-value output signal $|x_{n-1}|$ provides a maximum-value output signal max $(|x_n|, |x_{n-1}|)$. The sum means includes means for also summing the maximum-value output signal together with the sampled absolute-value output signal $|x_n|$ and the delayed sampled absolute-value output signal $|x_{n-1}|$ to provide the summed output signal $|x_n| + |x_{n-1}| + \max(|x_n|, |x_{n-1}|)$.

One method provided by the invention makes use of the square of the sampled value of an input signal for detecting defects in the magnetic medium of a disk drive system for recording information on a magnetic disk medium. The disk drive system includes a read channel which provides an output signal and the system also generates a recovered clock signal. The method includes the steps of: sampling the output signal of the read channel to provide a sampled output signal $x_n$; squaring the sampled output signals from the read channel and providing a squared sampled output signal $x_n^2$; delaying the squared sampled output signal and providing a delayed squared sampled output signal $x_{n-1}^2$; summing the squared sampled output signal with the delayed squared output signal and providing a sum output signal $(x_{n-1}^2 + x_{n-1}^2)$; subtracting the square of the expected value $K_n^2$ of the sum of the squared sampled output signal and the delayed squared output signal to provide a difference output signal; and determining with a threshold detector when the difference output signal of the subtraction means exceeds a predetermined threshold to provide an output signal indicative of a defect in the medium. This method provides that the step of determining with a threshold detector includes determining when the absolute value of the difference output signal of the subtraction means exceeds a predetermined threshold value to provide the signal indicative of a defect in the medium. Optionally, the step of determining with a threshold detector includes determining when the difference output signal of the subtraction means exceeds either a predetermined upper threshold value or a predetermined lower value to provide the output signal indicative of a defect in the medium. The expected value $K_n^2$ may be a constant in a system, for example, with AGC.

Another method provided by the invention makes use of the absolute value of the sampled value of an input signal for detecting defects in the magnetic medium of a disk drive system for recording information on a magnetic disk medium. This method includes the steps of: sampling the output signal of the read channel to provide a sampled output signal; taking the absolute value of the sampled output signal to provide a sampled absolute-value output signal $|x_n|$; delaying the sampled absolute-value output signal to provide a delayed sampled absolute-value output signal $|x_{n-1}|$; summing the sampled absolute-value output signal $|x_n|$ and the delayed sampled absolute-value output signal $|x_{n-1}|$ to provide a summed output signal $|x_n| + |x_{n-1}|$; subtracting the value of a tracking threshold estimator signal from the summed output signal to provide a difference output signal; determining with a threshold detector when the difference output signal of the subtraction means exceeds a predetermined threshold to provide an output signal indicative of a defect in the medium. Threshold detection is similar to the other method. This method also can includes the step of determining the maximum of either the sampled absolute-value output signal $|x_n|$ or the delayed sampled absolute-value output signal $|x_{n-1}|$ to provide a maximum-value output signal max $(|x_{n-1}, |x_{n-1}|)$. The step of summing includes the summing the maximum-value output signal together with the sampled absolute-value output signal $|x_n|$ and the delayed sampled absolute-value output signal $|x_{n-1}|$ to provide the summed output signal $|x_n| + |x_{n-1}| + \max(|x_n|, x_{n-1}|)$.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
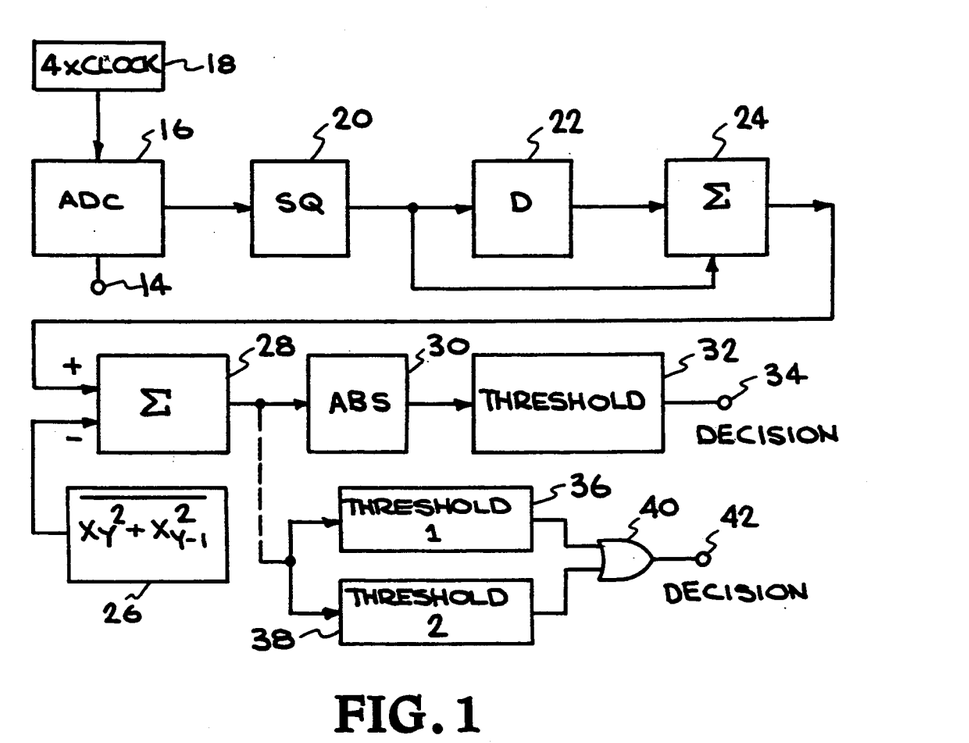
FIG. 1 is a schematic block diagram of a sampled-data discrete time system for detecting flaws in a magnetic storage media, which system squares the value of the input signals according to the invention.

FIG. 1 shows a sampled-data discrete time system 10 for detecting flaws in a magnetic storage media. A uniform data test pattern is first written onto a disk. This test pattern is then read by the read channel of the disk system to provide a read-back signal with a sinusoidal waveform at the at input terminal 14 of an analog-to-digital converter (ADC) circuit 16. A sampling clock from the disk system at clock terminal 18 of the ADC circuit 16. The sampling clock signal has a frequency which is 4 times the frequency of the sinusoidal waveform provided by reading the test pattern on the disk. The sampling clock signal also provides clock signal pulses for the system 10. The output of the ADC circuit 16 is a sampled data signal xn. The ADC circuit 16 provides four digital data samples xn for each period of the sinusoidal waveform.

A digital squaring circuit 20 squares the sampled data output signal $x_n$ and provides a squared sampled data output signal $x_n^2$ at its output terminals. The squared sampled data output signal $x_n^2$ is the delayed for one sample clock pulse period in a digital delay circuit 22, which provides a delayed squared sampled data output signal $x_{n-1}^2$ The squared sampled data output signal and the delayed squared sampled data output signal $x_{n-1}^2$ are then summed together in a digital summing circuit 24, which provides a sum output signal $(x_n^2+x_{n-1}^2)$.

A squared expected value circuit 26 provides the square of the expected value $K_n^2$. The square of the expected value $K_n^2$ equals the average value $(x_n^2+x_{n-1}^2)$ of the sum output signal $(x_n^2+x_{n-1}^2)$ A digital subtraction circuit 28 digitally subtracts the square of the expected value $K_n^2$ from the sum output signal $(x_n^2+x_{n-1}^2)$ to provide a difference output signal $(x_n^2+x_{n-1}^2)-K_n^2)$ The square of the expected value $K_n^2$ is a constant where, for example, when the read channel of disk system has an automatic gain control (AGC) system.

One of several optional threshold circuit arrangements are then used to process the output signal from the digital subtraction circuit 28 to provide an output signal indicative of a defect in the medium.

One threshold circuit arrangement includes an absolute value circuit 30 which takes the absolute value of the difference output signal from the subtraction circuit 28 and provides a digital output signal indicative thereof. A threshold circuit 32 provides an output signal at an output terminal 34 indicative of a defect in the medium. An output signal is provided when absolute value of the output signal of the subtraction circuit 28 exceeds a predetermined threshold value.

Another optional threshold circuit arrangement includes means for determining when the difference output signal of the subtraction circuit 28 exceeds either a predetermined upper threshold value or a predetermined lower value. An upper threshold circuit 36 provides an output signal when the predetermined upper threshold value is exceeded and a lower threshold circuit 38 provides and output signal when the predetermined lower value is not achieved. The output signals of the upper threshold circuit 36 and the lower threshold circuit 38 are logically combined in an OR gate 40 which provides an output signal at an output terminal 42, which signal is indicative of a defect in the medium.

Equation (1) represents the operation performed by the sampled-data discrete time system 10 for detecting flaws in a magnetic storage media.

If $|(x_n^2+x_{n-1}^2)-K_n^2|>$Threshold Value (Th), then a flaw is detected (1)

The signal $x_n$ is a digitized representation of cosine $\theta$ and $x_{n-1}$ is a digitized representation of cosine $\theta$. A (t) is the output of the sum circuit 24.

For FIG. 1, $A^2(t)$ $(\sin^2\theta+\cos^2\theta)=A^2(t)$, where $A(t)=(1\pm\epsilon)$ and $A^2(t)=1\pm2\epsilon+\epsilon^2$. For small values of s and DC blocking, $A^2(t)=2\epsilon$.

The result of the system of FIG. 1 is phase insensitive and does not require phase synchronous sampling.

Figure 2:
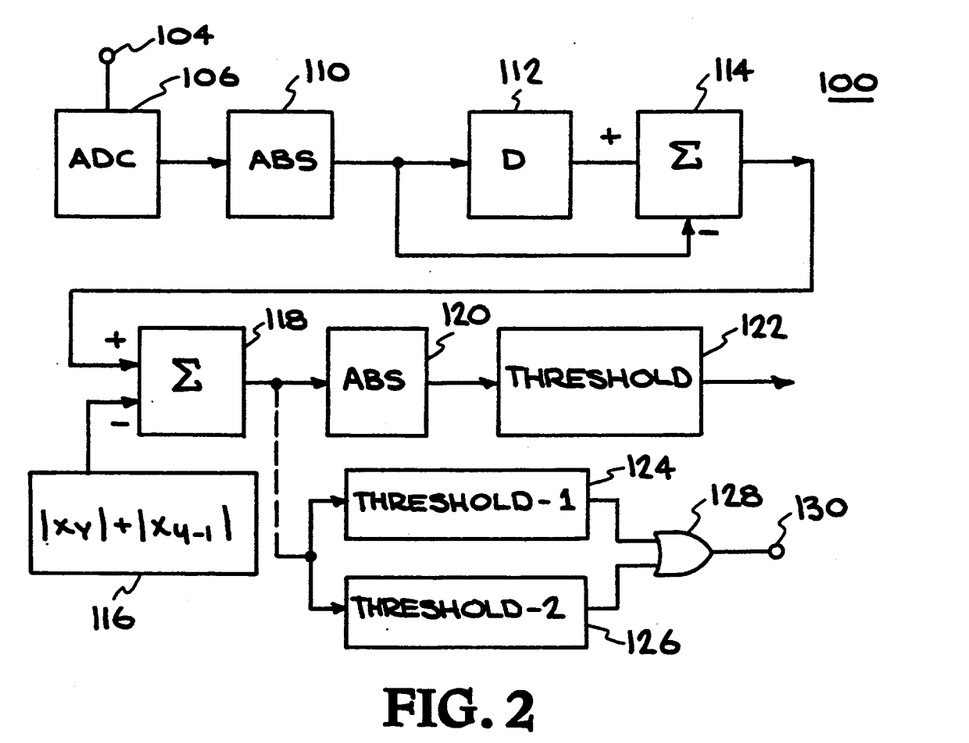
FIG. 2 is a schematic block diagram of a sampled-data discrete time system for detecting flaws in magnetic storage media, which system uses the magnitudes of the values of the input signals.

FIG. 2 shows a block diagram of an alternative embodiment of a sampled-data discrete time system 100 for detecting flaws in magnetic storage media. This system uses the magnitudes, or absolute values, of the values of the discrete input signals, as approximations to the squares of the input signals.

As described previously in connection with the previous embodiment of the invention, a uniform data test pattern is first written onto a disk. This test pattern is then read by the read channel of the disk system to provide a read-back signal with a sinusoidal waveform at the at input terminal 104 of an analog-to-digital converter (ADC) circuit 106. A sampling clock from the disk system at clock terminal 108 of the ADC circuit 106. The sampling clock signal has a frequency which is 4 times the frequency of the sinusoidal waveform provided by reading the test pattern on the disk. The output of the ADC circuit 106 is a sampled data signal $x_n$. The ADC circuit 106 provides four digital data samples $x_n$ for each period of the sinusoidal waveform.

The digital output signals of the ADC circuit 106 are then fed to the input terminal of an absolute value circuit 110 which provides a digital absolute-value output signal $|x_n|$. The absolute-value output signal $|x_n|$ output signal is then delayed for one clock pulse period in a digital delay circuit 112 to provide a delayed sampled absolute-value output signal $|x_{n-}|$ at the output terminal of the digital delay circuit 112. A digital summing circuit 114 sums the sampled absolute-value output signal $|x_n|$ and the delayed sampled absolute-value output signal $|x_{n-1}|$ to provide a summed output signal $|x_n|+|x_{n-1}|$.

An expected value circuit 116 provides an estimate of the expected value $K_n$. The expected value Kn equals the average value avg.val $[|x_n|+|x_{n-1}|]$ of the summed output signal $|x_n|+|x_{n-1}|$. A digital subtraction circuit 118 digitally subtracts the expected value $K_n$ from the summed output signal to provide a difference output signal $|x_n|+|x_{n-1}|-K_n$. The expected value $K_n$ is a constant where, for example, the a read channel of disk system has an automatic gain control (AGC) system.

As in the previously discussed embodiment of the invention, one of several optional threshold circuit arrangements are then used to process the output signal from the digital subtraction circuit 118 to provide an output signal indicative of a defect in the medium.

One threshold circuit arrangement includes an absolute value circuit 120 which takes the absolute value of the difference output signal from the subtraction circuit 118 and provides a digital output signal indicative thereof. A threshold circuit 122 provides an output signal at an output terminal 124 indicative of a defect in the medium. An output signal is provided when absolute value of the output signal of the subtraction circuit 118 exceeds a predetermined threshold value.

Another optional threshold circuit arrangement includes means for determining when the difference output signal of the subtraction circuit 118 exceeds either a predetermined upper threshold value or a predetermined lower value. An upper threshold circuit 124 provides an output signal when the predetermined upper threshold value is exceeded and a lower threshold circuit 126 provides and output signal when the predetermined lower value is not achieved. The output signals of the upper threshold circuit 124 and the lower threshold circuit 126 are logically combined in an OR gate 128 which provides an output signal at an output terminal 130, which signal is indicative of a defect in the medium.

Equation (2) represents the operation performed by the sampled-data discrete time system 100 for detecting flaws in a magnetic storage media. Equation (2) approximates the performance of Equation (1).

$$\text{If } ||x_n|+|x_{n-1}|-K_n||>Th, \tag{2}$$

then a flaw is detected.

This result of this system is phase insensitive to a first approximation and does not require phase synchronous sampling.

Figure 3:
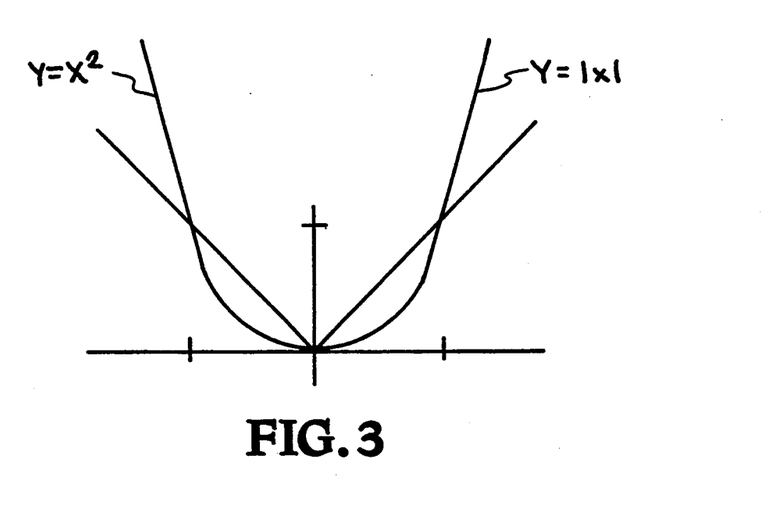
FIG. 3 shows comparison plots of $y=x^2$ and $y=|x|$ to compare defect detection with squared signals and with absolute values of signals.

FIG. 3 compares plots of $y=x^2$ and $y=|x|$. The system of FIG. 1 is represented by Equation (1), which uses squared terms. The system of FIG. 2 is represented by Equation (2). This plot shows that Equation (1) can be approximated by Equation (2).

Figure 4A:
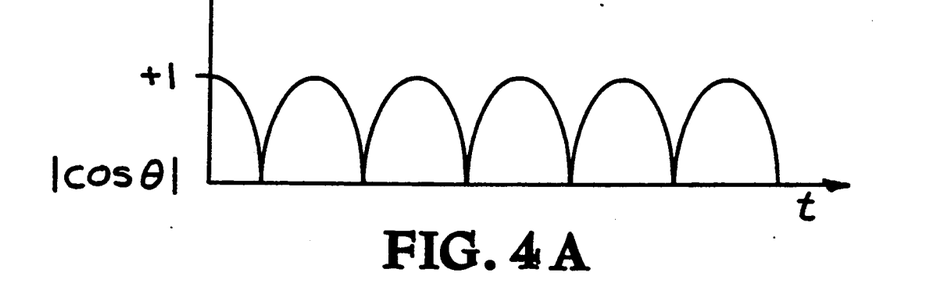
FIG. 4A shows a rectified cosine waveform.

FIG. 4A plots the absolute value of the xn values for the non-delayed signal which is represented as a cosine function $\cos\theta$.

Figure 4B:
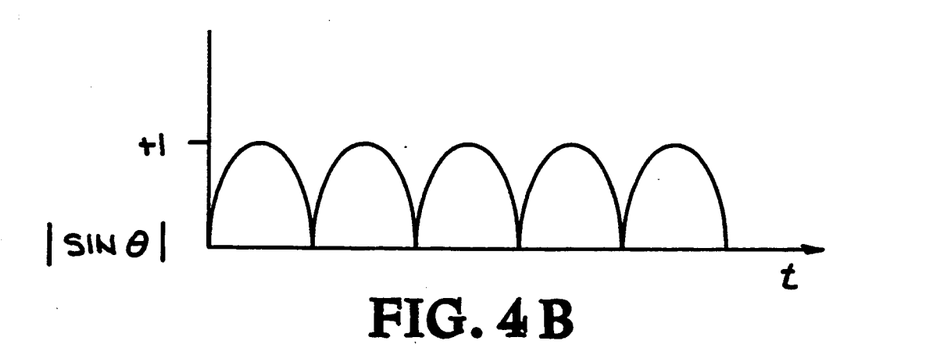
FIG. 4B shows a rectified sine waveform.

FIG. 4B plots the absolute value of the $x_{n-1}$, values for the delayed signal which is represented as a sine function $\sin\theta$.

Equation (1) is approximated by Equation (2). A system according to Equation (2) is more sensitive to sample-time errors. In a high signal-to-noise ratio (SNR) environment, this approximation does not limit performance.

The value of the constant Kn could be set by a simple fading memory moving average. For a system according to Equation (1), $$K_n^2=(m-1)|x_n^2+m\ K_{n-1}^2, \text{ where } 0<m<1. \tag{3}$$

For a system according to FIG. 2, Equation (3) can be approximated by $$K_n=(m-1)|x_n|+m\ K_{n-1} \tag{4}$$

Figure 4C:
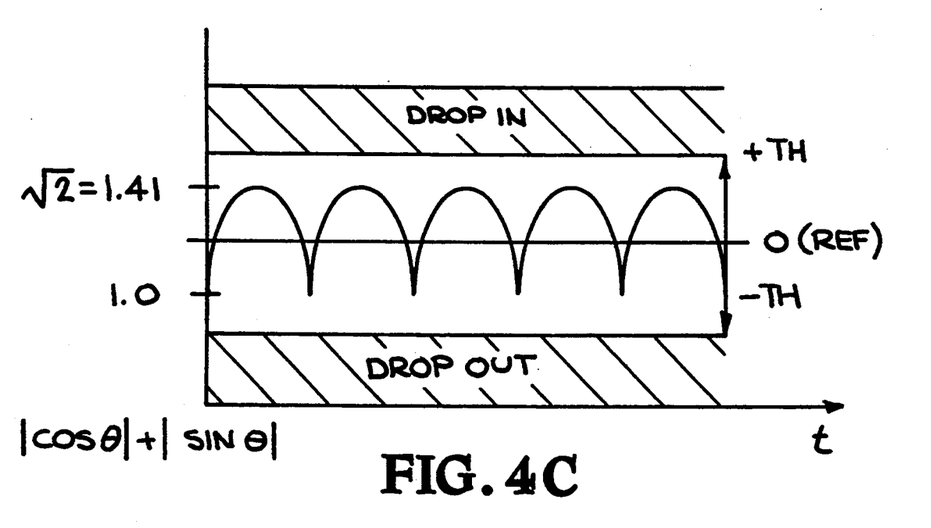
FIG. 4C shows a waveform which is the sum of the rectified cosine and sine waveforms.

FIG. 4C shows signal waveforms and the upper and lower threshold values for the signals provided to the threshold detectors of FIGS. 1 and 2. For FIG. 1, the $(\sin^2\theta+\cos^2\theta)$ term has a value of 1.0 and it identified as the "O Reference" level. The error signals range about this value and are detected by: either (a) a "−Threshold" level, which is caused by a relatively rare "drop in" defects on a disk, or (b) a "+Threshold" level, which is caused by "drop out" defects.

For the absolute value system of FIG. 2, the sum of the absolute values of the sin $\theta$ and cos $\theta$ terms ranges between 1.0 and 1.4 1 where the level at 1.41 indicates the peak value of the sum of $|\cos\theta|+|\sin\theta|$.

Figure 5:
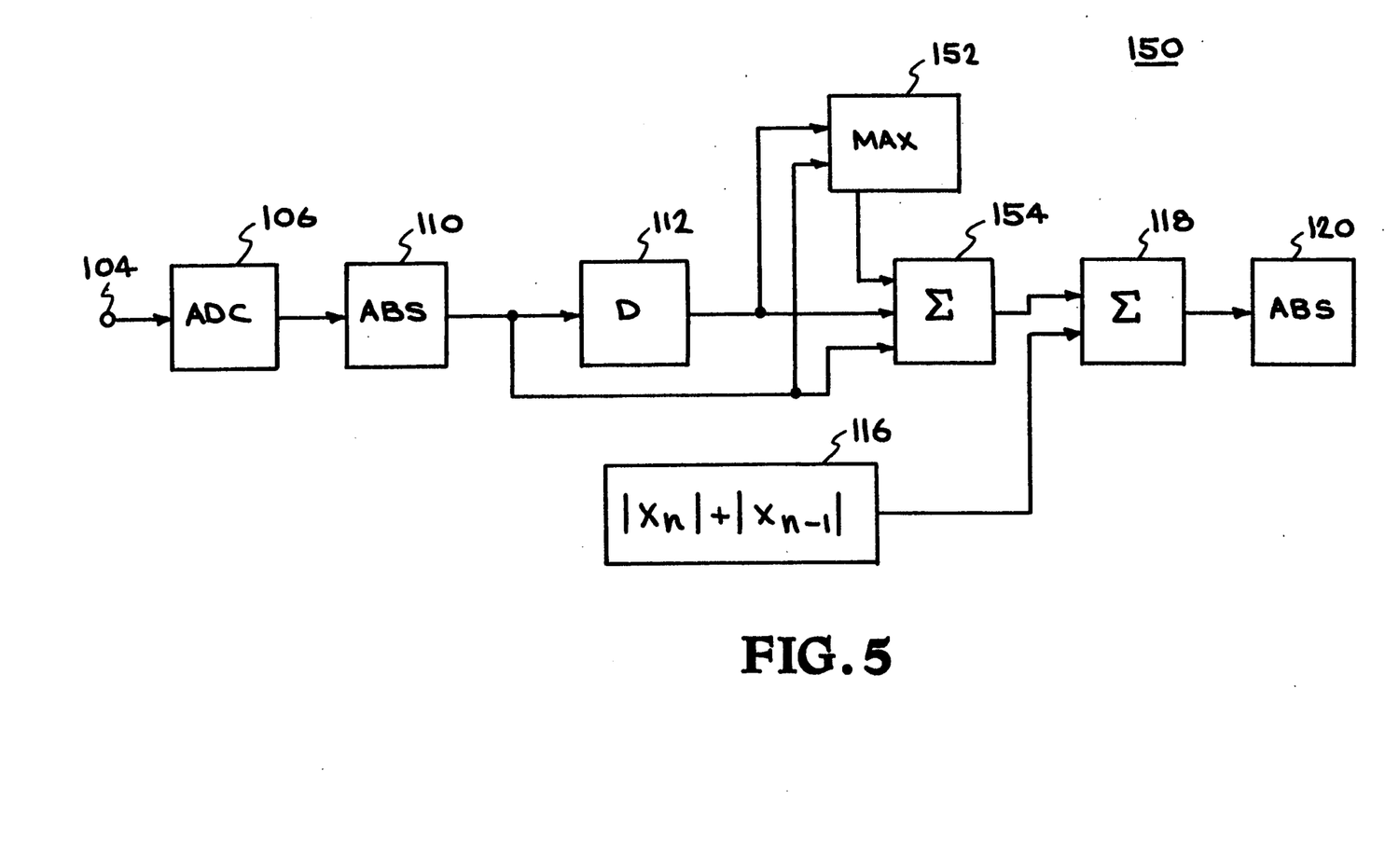
FIG. 5 is a schematic block diagram of a system similar to the system of FIG. 2 with the addition of a maximum value detector.

FIG. 5 shows a block diagram of an alternative embodiment of a sampled-data discrete time system 150 for detecting flaws in magnetic storage media. The system 150 is similar to the system of FIG. 2 with the addition of a maximum value detector. Similar reference numerals are used for similar system elements. This system 150 also uses the magnitudes, or absolute values, of the values of the discrete input signals, rather than the squares of the input signals.

As described previously in connection with the previous embodiment of the invention, a uniform data test pattern is first written onto a disk. This test pattern is then read by the read channel of the disk system to provide a read-back signal with a sinusoidal waveform at the at input terminal 104 of an analog-to-digital converter (ADC) circuit 106. A sampling clock from the disk system at clock terminal 108 of the ADC circuit 106. The sampling clock signal has a frequency which is 4 times the frequency of the sinusoidal waveform provided by reading the test pattern on the disk. The output of the ADC circuit 106 is a sampled data signal xn. The ADC circuit 106 provides four digital data samples xn for each period of the sinusoidal waveform. The digital output signals of the anti-aliasing digital filter circuit 108 are then fed to the input terminal of an absolute value circuit 110 which provides a digital absolute-value output signal $|x_n|$. The absolute-value output signal $|x_n|$ output signal is then delayed for one clock pulse period in a digital delay circuit 112 to provide a delayed sampled absolute-value output signal $|x_{n-1}|$ at the output terminal of the digital delay circuit 112.

A maximum value circuit 152 is provided for determining the maximum of either the sampled absolute-value output signal $|x_n|$ or the delayed sampled absolute-value output signal $|x_{n-1}|$ to provide a maximum-value output signal max $(|x_n|,|x_{n-1}|)$ at its output terminal. If $|xn|$ is greater than $|x_{n-1}|$, then the output of the circuit is $|x_n|$. If $|x_{n-1}|$ is greater than $|xn|$, then the output of the circuit is $|x_{n-1}|$.

A three-input digital summing circuit 154 sums the maximum-value output signal max $(|x_n|,|x_{n-1}|)$, the sampled absolute-value output signal $|x_n|$, and the delayed sampled absolute-value output signal $|x_{n-1}|$ to provide a summed output signal $|x_n|+|x_{n-1}|+\max(|x_n|,|x_{n-1}|)$.

As previously described in connection with FIG. 2, the expected value circuit 116 provides an estimate of the expected value $K_n$. The expected value $K_n$ equals the average value $|x_n|+|x_{n-1}|+\max(|x_n|,|x_{n-1}|)$ of the summed output signal $|x_n|+|x_{n-1}|+\max(|x_n|,|x_{n-1}|)$. A digital subtraction circuit 118 digitally subtracts the expected value $K_n$ from the summed output signal to provide a difference output signal $|x_n|+|x_{n-1}|-K_n$. The expected value $K_n$ is a constant where, for example, the a read channel of disk system has an automatic gain control (AGC) system.

As in the previously discussed embodiment of the invention, one of several optional threshold circuit arrangements are then used to process the output signal from the digital subtraction circuit 118 to provide an output signal indicative of a defect in the medium.

One threshold circuit arrangement includes an absolute value circuit 120 which takes the absolute value of the difference output signal from the subtraction circuit 118 and provides a digital output signal indicative thereof. A threshold circuit 122 provides an output signal at an output terminal 124 indicative of a defect in the medium. An output signal is provided when absolute value of the output signal of the subtraction circuit 118 exceeds a predetermined threshold value.

Another optional threshold circuit arrangement described in conjunction with FIG. 2 includes means for determining when the difference output signal of the subtraction circuit 118 exceeds either a predetermined upper threshold value or a predetermined lower value. An upper threshold circuit 124 provides an output signal when the predetermined upper threshold value is exceeded and a lower threshold circuit 126 provides and output signal when the predetermined lower value is not achieved. The output signals of the upper threshold circuit 124 and the lower threshold circuit 126 are logically combined in an OR gate 128 which provides an output signal at an out,put terminal 130, which signal is indicative of a defect in the medium.

Equation (5) represents the operation performed by the sampled-data discrete time system 150 of FIG. 5 for detecting flaws in a magnetic storage media.

$$\text{If } |x_n|+|x_{n-1}|+\max(|x_n|,|x_{n-1}|)-K_n > Th, \quad (5)$$

then a flaw is detected.

Figure 6:
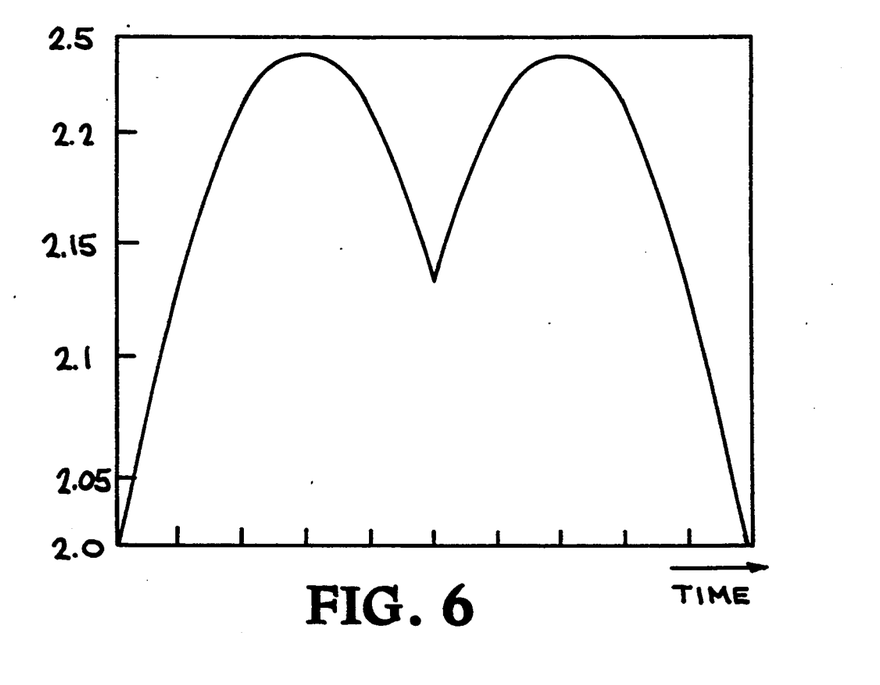
FIG. 6 shows a waveform which is a smooth representation of the sum of a rectified cosine signal, a rectified sine signal, and the maximum value of either the rectified cosine or sine signals.

FIG. 6 shows the ,output of the three-input summing circuit 154. For the absolute value system of FIG. 5, which also uses the maximum value detector, the levels vary between 2.0 and 2.25 for a range of approximately 12 per cent compared to the 40 percent range of the absolute value system of FIG. 2. The system of FIG. 1 which uses the squared terms has no variation in the range of the sum output of the sum circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. For a disk drive system for recording information on a magnetic disk medium which includes a read channel for providing an output signal and a means for generating a recovered clock signal, an apparatus for detecting defects in the magnetic medium, comprising:

sample means for sampling the output signal of the read channel to provide a sampled output signal $x_n$;

squaring means for squaring the sampled output signals from the read channel and for providing a squared sampled output signal $x_n^2$;

delay means for delaying the squared sampled output signal and for providing a delayed squared sampled output signal $x_{n-1}^2$;

summing means for summing the squared sampled output signal with the delayed squared output signal and for providing a sum output signal $(x_n^2+x_{n-1}^2)$;

subtraction means for subtracting the square of the expected value $K_n^2$ of the sum of the squared sampled output signal and the delayed squared output signal to provide a difference output signal;

threshold means for determining when the difference output signal of the subtraction means exceeds a predetermined threshold to provide an output signal indicative of a defect in the medium.

2. The apparatus of claim 1 wherein the threshold means includes means for determining when the absolute value of the difference output signal of the subtraction means exceeds a predetermined threshold value to provide the signal indicative of a defect in the medium.

3. The apparatus of claim 1 wherein the threshold means includes means for determining when the difference output signal of the subtraction means exceeds either a predetermined upper threshold value or a predetermined lower value to provide the output signal indicative of a defect in the medium.

4. The apparatus claim 1 wherein the square of the expected value $K_n^2$ is a constant.

5. The apparatus of claim 1 including means for writing a uniform pattern on the magnetic disk medium such that the read-back waveform is sinusoidal through an anti-aliasing filter prior to a sampling analog-to-digital converter.

6. The apparatus of claim 5 wherein the means for sampling the output signal of the read channel to provide a sampled output signal includes means for sampling the signal at a rate of 4 times the frequency of the sinusoidal read-back waveform.

7. For a disk drive system for recording information on a magnetic disk medium which includes a read channel for providing an output signal and a means for generating a recovered clock signal, an apparatus for detecting defects in the medium, comprising:

sample means for sampling the output signal of the read channel to provide a sampled output signal;

means for taking the absolute value of the sampled output signal to provide a sampled absolute-value output signal $|x_n|$;

delay means for delaying the sampled absolute-value output signal to provide a delayed sampled absolute-value output signal $|x_{n-1}|$;

sum means for summing the sampled absolute-value output signal $|x_n|$ and the delayed sampled absolute-value output signal $|x_{n-1}|$ to provide a summed output signal $|x_n|+|x_{n-1}|$;

subtraction means for subtracting the value of a tracking threshold estimator signal from the summed output signal to provide a difference output signal;

threshold means for determining when the difference output signal of the subtraction means exceeds a predetermined threshold to provide an output signal indicative of a defect in the medium.

8. The apparatus of claim 7 wherein the threshold means includes means for determining when the absolute value of the difference output signal of the subtraction means exceeds a predetermined threshold value to provide the signal indicative of a defect in the medium.

9. The apparatus of claim 7 wherein the threshold means includes means for determining when the difference output signal of the subtraction means exceeds either a predetermined upper threshold value or a predetermined lower value to provide the output signal indicative of a defect in the medium.

10. The apparatus of claim 7 wherein the tracking threshold estimator signal is a constant.

11. The apparatus of claim 7 including means for writing a uniform pattern on the magnetic disk medium such that the read-back waveform is sinusoidal through an anti-aliasing filter prior to a sampling analog-to-digital converter.

12. The apparatus of claim 11 wherein the means for sampling the output signal of the read channel to provide a sampled output signal includes means for sampling the signal at a rate of 4 times the frequency of the sinusoidal read-back waveform.

13. A method of detecting defects in the magnetic medium of a disk drive system for recording information on a magnetic disk medium, which disk drive system includes a read channel providing an output signal and which generates a recovered clock signal, comprising the steps of:

sampling the output signal of the read channel to provide a sampled output signal $x_n$;

squaring the sampled output signals from the read channel and providing a squared sampled output signal $x_n^2$;

delaying the squared sampled output signal and providing a delayed squared sampled output signal $x_{n-1}^2$;

summing the squared sampled output signal with the delayed squared output signal and providing a sum output signal $(x_n^2 + x_n^2)$;

subtracting the square of the expected value $K_n^2$ of the sum of the squared sampled output signal and the delayed squared output signal to provide a difference output signal;

determining with a threshold detector when the difference output signal of the subtraction means exceeds a predetermined threshold to provide an output signal indicative of a defect in the medium.

14. The method of claim 13 wherein the step of determining with a threshold detector includes determining when the absolute value of the difference output signal of the subtraction means exceeds a predetermined threshold value to provide the signal indicative of a defect in the medium.

15. The apparatus of claim 13 wherein the step of determining with a threshold detector includes determining when the difference output signal of the subtraction means exceeds either a predetermined upper threshold value or a predetermined lower value to provide the output signal indicative of a defect in the medium.

16. The method of claim 13 wherein the expected value $K_n^2$ is a constant.

17. The method of claim 13 including writing a uniform pattern on the magnetic disk medium such that the read-back waveform is sinusoidal through an anti-aliasing filter prior to a sampling analog-to-digital converter.

18. The method of claim 17 wherein the step of sampling the output signal of the read channel to provide a sampled output signal includes sampling the signal at a rate of 4 times the frequency of the sinusoidal read-back waveform.

19. A method of detecting defects in the magnetic medium of a disk drive system for recording information on a magnetic disk medium, which disk drive system includes a read channel providing an output signal and which generates a recovered clock signal, comprising the steps of:

sampling the output signal of the read channel to provide a sampled output signal;

taking the absolute value of the sampled output signal to provide a sampled absolute-value output signal $|x_n|$;

delaying the sampled absolute-value output signal to provide a delayed sampled absolute-value output signal $|x_{n-1}|$;

summing the sampled absolute-value output signal $|x_n|$ and the delayed sampled absolute-value output signal $|x_{n-1}|$ to provide a summed output signal $|x_n| + |x_{n-1}|$;

subtracting the value of a tracking threshold estimator signal from the summed output signal to provide a difference output signal;

determining with a threshold detector when the difference output signal of the subtraction means exceeds a predetermined threshold to provide an output signal indicative of a defect in the medium.

20. The method of claim 19 wherein the step of determining with a threshold detector includes determining when the absolute value of the difference output signal of the subtraction means exceeds a predetermined threshold value to provide the signal indicative of a defect in the medium.

21. The method of claim 19 wherein the stop of determining with a threshold detector includes determining when the difference output signal of the subtraction means exceeds either a predetermined upper threshold value or a predetermined lower value to provide the output signal indicative of a defect in the medium.

22. The method of claim 19 wherein the tracking threshold estimator signal is a constant.

23. The method of claim 19 including means for writing a uniform pattern on the magnetic disk medium such that the read-back waveform is sinusoidal through an anti-aliasing filter prior to a sampling analog-to-digital converter.

24. The method of claim 19 wherein the step of sampling the output signal of the read channel to provide a sampled output signal includes sampling the signal at a ratio of 4 times the frequency of the sinusoidal read-back waveform.

* * * * *